(12) United States Patent
Hack

(10) Patent No.: US 9,947,728 B2
(45) Date of Patent: Apr. 17, 2018

(54) HYBRID MEMS OLED DISPLAY

(71) Applicant: Universal Display Corporation, Ewing, NJ (US)

(72) Inventor: Michael Hack, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 54 days.

(21) Appl. No.: 15/241,608

(22) Filed: Aug. 19, 2016

(65) Prior Publication Data

US 2017/0062531 A1    Mar. 2, 2017

Related U.S. Application Data

(60) Provisional application No. 62/209,471, filed on Aug. 25, 2015.

(51) Int. Cl.
*H01L 51/52* (2006.01)
*H01L 27/32* (2006.01)
*B81B 3/00* (2006.01)

(52) U.S. Cl.
CPC ........ *H01L 27/3232* (2013.01); *B81B 3/0083* (2013.01); *H01L 27/3213* (2013.01); *H01L 27/3218* (2013.01); *H01L 27/3225* (2013.01); *B81B 2201/047* (2013.01); *H01L 27/322* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Michael Lebentritt
(74) *Attorney, Agent, or Firm* — Riverside Law LLP

(57) ABSTRACT

A hybrid display includes a blue LED backlight layer, at least one shutter element, a frontplane having multiple sub-pixels, and a backplane operatively connected to the frontplane and the at least one shutter element. The backplane and the at least one shutter element are positioned between the backlight layer and the frontplane.

20 Claims, 5 Drawing Sheets

(56) References Cited

U.S. PATENT DOCUMENTS

| | | | |
|---|---|---|---|
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,551,344 B2 | 6/2009 | Hagood et al. | |
| 7,755,582 B2 | 7/2010 | Hagood et al. | |
| 7,968,146 B2 | 6/2011 | Wanger et al. | |
| 9,385,168 B2 | 7/2016 | Hack et al. | |
| 9,547,202 B2* | 1/2017 | Lo | G02F 1/134336 |
| 9,547,213 B2* | 1/2017 | Lee | G02F 1/155 |
| 2002/0145685 A1* | 10/2002 | Mueller-Mach | G02F 1/133617 349/61 |
| 2003/0230980 A1 | 12/2003 | Forrest et al. | |
| 2004/0174116 A1 | 9/2004 | Lu et al. | |
| 2007/0063961 A1* | 3/2007 | Kuroki | G09G 3/3413 345/102 |
| 2010/0085727 A1* | 4/2010 | Igarashi | G02F 1/133603 362/84 |
| 2011/0121234 A1* | 5/2011 | Hirosaki | C09K 11/0883 252/301.4 F |
| 2012/0162270 A1* | 6/2012 | Fleck | G09G 3/3413 345/690 |
| 2012/0287494 A1* | 11/2012 | Takahashi | G02B 26/02 359/230 |
| 2013/0026452 A1 | 1/2013 | Kottas et al. | |
| 2013/0038641 A1* | 2/2013 | Muneyoshi | G02B 26/023 345/690 |
| 2013/0119354 A1 | 5/2013 | Ma et al. | |
| 2014/0159067 A1 | 6/2014 | Sakariya et al. | |
| 2015/0092137 A1 | 4/2015 | Sim Sangjin et al. | |
| 2015/0340410 A1 | 11/2015 | Hack et al. | |
| 2015/0349034 A1 | 12/2015 | Hack et al. | |
| 2016/0218150 A1 | 7/2016 | Hack et al. | |
| 2017/0047021 A1* | 2/2017 | Yashiki | G09G 3/34 |
| 2017/0084671 A1 | 3/2017 | Hack et al. | |
| 2017/0194503 A1* | 7/2017 | Yamazaki | H01L 29/7869 |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

Hagood, Nesbitt et al., "Pixtronix DMS™ Display Technology: Ultra-Low Power Consumption and Exceptional Video Image Quality", Pixtronix, Inc. 2008. pp. 1-3.

* cited by examiner

HYBRID MEMS OLED DISPLAY

CROSS-REFERENCE TO RELATED APPLICATIONS

This application claims priority to U.S. Provisional Patent Application Ser. No. 62/209,471, filed Aug. 25, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to displays and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

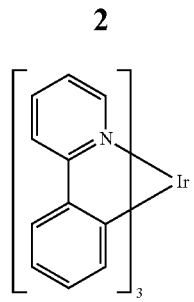

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

MEMS based shutters have been developed to enable the use of high efficiency displays illuminated by sequential color RGB backlights. One issue with conventional MEMS based shutter architectures is color break up related to the pulsing of the RGB backlights which requires high switching speeds (1 KHz) to avoid visual artifacts. This issue becomes progressively more predominant as the display size increases due to RC delays in backplane impairing synchronization between the shutters and the backlights.

Further, OLED displays currently have issues related to patterning technologies. For instance, there are particulate and scaling issues when utilizing fine metal mask patterning techniques, efficiency and lifetime issues when utilizing while OLED plus color filter architectures, as well as various issues related to deep blue efficiency, lifetime and image sticking.

Accordingly, there is need in the art for an OLED display that improves levels of power consumption, brightness, lifetime, yield and optical performance.

SUMMARY OF THE INVENTION

According to one embodiment, a hybrid display, includes a blue LED backlight layer; at least one shutter element, a frontplane including multiple sub-pixels, and a backplane operatively connected to the frontplane and the at least one shutter element, where the backplane and the at least one shutter element are positioned between the backlight layer and the frontplane. In one embodiment, the at least one shutter element is further positioned between the backlight layer and the backplane. In one embodiment, the at least one shutter element is further positioned between the frontplane and the backplane. In one embodiment, the LED backlight layer and one shutter element is disposed on a first substrate, and the frontplane is disposed on a second substrate. In one embodiment, the shutter elements may be driven passive matrix or active matrix, and the frontplane sub-pixels may also be driven passive matrix or active-matrix. In one embodiment, the at least one shutter element is a MEMS. In one embodiment, the at least one shutter element is an LCD. In one embodiment, the backlight layer is a back-lit LED. In one embodiment, the backlight layer is an edge-lit LED. In one embodiment, the backplane comprises a substrate, a plurality of bus lines and a thin film transistor array. In one embodiment, the thin film transistor array is an active matrix thin film transistor array. In one embodiment, the backplane comprises a substrate, a plurality of bus lines and drives the frontplane and the at least one shutter element as a passive matrix display. In one embodiment, at least one sub-pixel is a blue sub-pixel formed from blue light emitted from the backlight layer passing through the shutter element. In one embodiment, the blue sub-pixel is shared between at least two adjacent pixels. In one embodiment, the blue sub-pixel is shared between at least four pixels. In one embodiment, the frontplane further comprises red and green patterned OLED sub-pixels. In one embodiment, the frontplane further comprises an unpatterned yellow light emitting OLED. In one embodiment, the frontplane further comprises color filters for forming red and green sub-pixels. In one embodiment, the display emits light of four different colors. In one embodiment, the emittance of blue light from the backlight layer is substantially uniform across the display. In one embodiment, the blue backlight layer is separated into regions of size greater than the size of a display pixel, such that each region can be locally dimmed for additional power savings dependent on the visual content of the image to be rendered. In one embodiment, the transmitted intensity of the blue light is provided by operation of the shutter element. In one embodiment, the transmitted intensity is provided by amplitude modulation of the shutter element. In one embodiment, the transmitted intensity is provided by pulse-width (time) modulation of the shutter element. In one embodiment, the display includes an insulator positioned between the at least one shutter element and the frontplane. In one embodiment, resolution of the at least one shutter element is less than the resolution of the display. In one embodiment, the display is daylight-readable. In one embodiment, the display is a top emission display. In one embodiment, the display is a bottom emission display. In one embodiment, a product including the display is selected from the group consisting of: a wearable display, a virtual-reality display, an augmented reality device, a mobile device, a flat panel display, a computer monitor, a medical monitor, a television, a touchscreen, a retractable projector screen, a billboard, a general illumination device, a signal, a heads-up display, a fully transparent display, a large area wall, a theater, a stadium screen, and a sign. According to another embodiment, the hybrid display includes a first organic light emitting device including an anode, a cathode, and an organic layer, disposed between the anode and the cathode.

DETAILED DESCRIPTION

Figure 1:
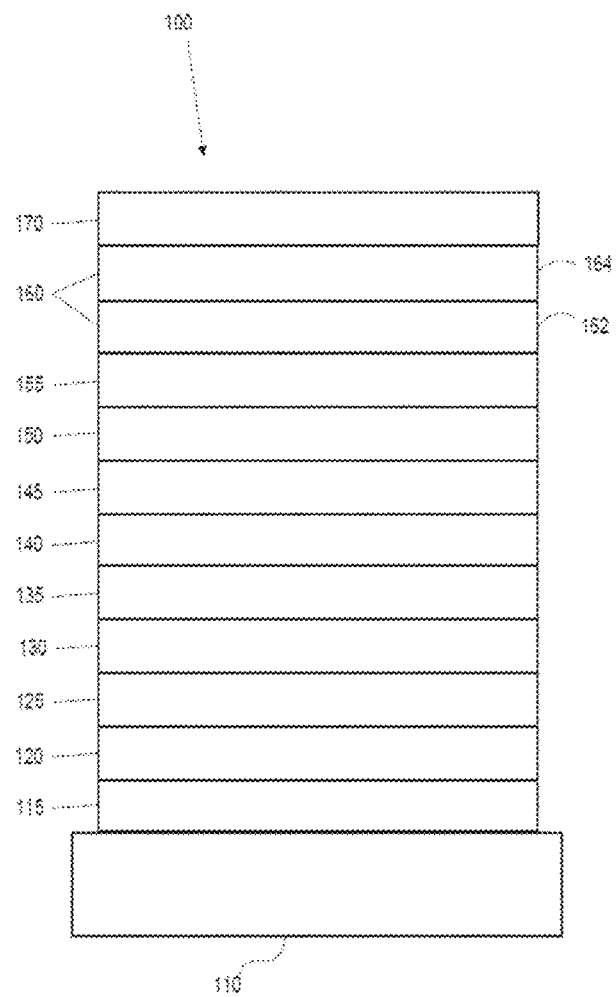
FIG. 1 shows an organic light emitting device.

It is to be understood that the figures and descriptions of the present invention have been simplified to illustrate elements that are relevant for a more clear comprehension of the present invention, while eliminating, for the purpose of clarity, many other elements found in a hybrid MEMS OLED display. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

"MEMS" as used herein means microelectromechanical system.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
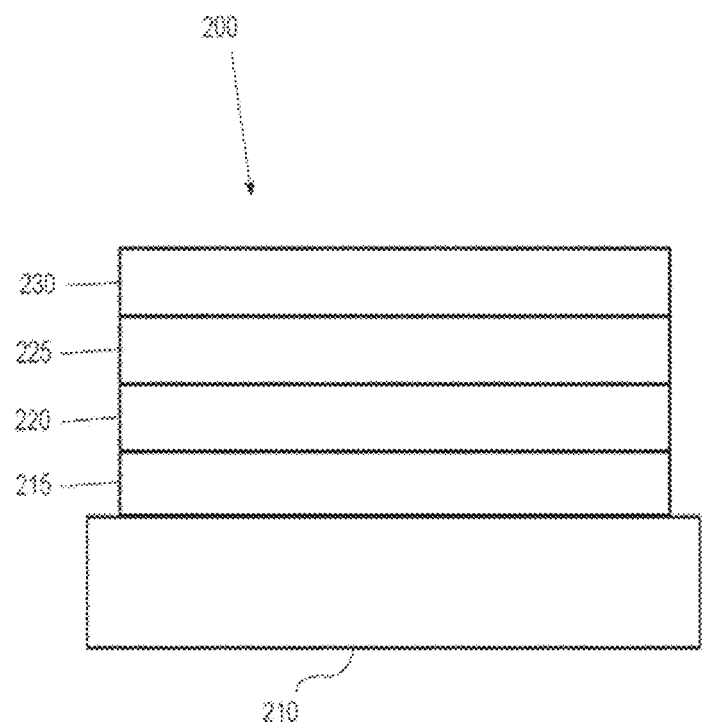
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3A:
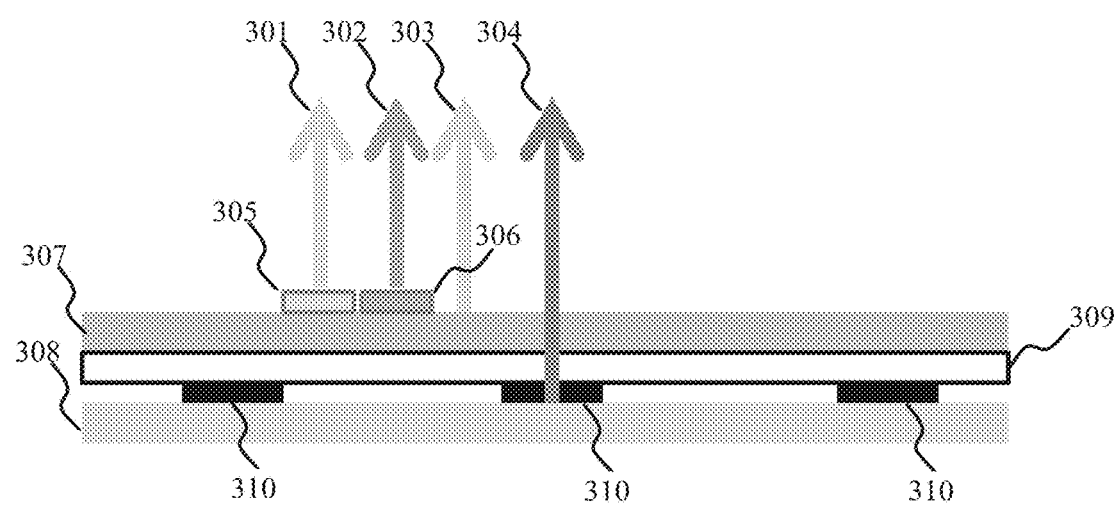
FIG. 3A shows a cross-section of a hybrid MEMS OLED display frontplane and backplane architecture according to one embodiment.

With reference now to FIG. 3A, a frontplane and backplane architecture is shown according to one embodiment. Shutter elements such as MEMS shutters 310 are positioned between a backlight layer 308 and a backplane 309. In certain embodiments, the backplane is an active matrix thin-film transistor (TFT) array backplane for controlling the MEMS shutters 310, unpatterned OLED 307 with color filters 305, 306 or patterned OLED pixels in the frontplane. In one embodiment, the backlight layer 308 is a blue backlight that can be a standard edge lit or backlit LED. In one embodiment, the unpatterned OLED 307 is a yellow OLED with color filters 305, 306 for producing red and green sub-pixel emission. Thus, red sub-pixel emission 301 is produced from the red color filter 305 and green sub-pixel emission 302 is produced from the green color filter 306. Yellow sub-pixel emission 303 is produced by the same unpatterned yellow OLED 307. The blue sub-pixel emission 304 is produced by opening and closing the MEMS shutters 310, allowing emission to pass through from the blue backlight 308. The shutter elements can be driven passive matrix or active matrix, and the frontplane sub-pixels may also be driven passive matrix or active-matrix.

Figure 3B:
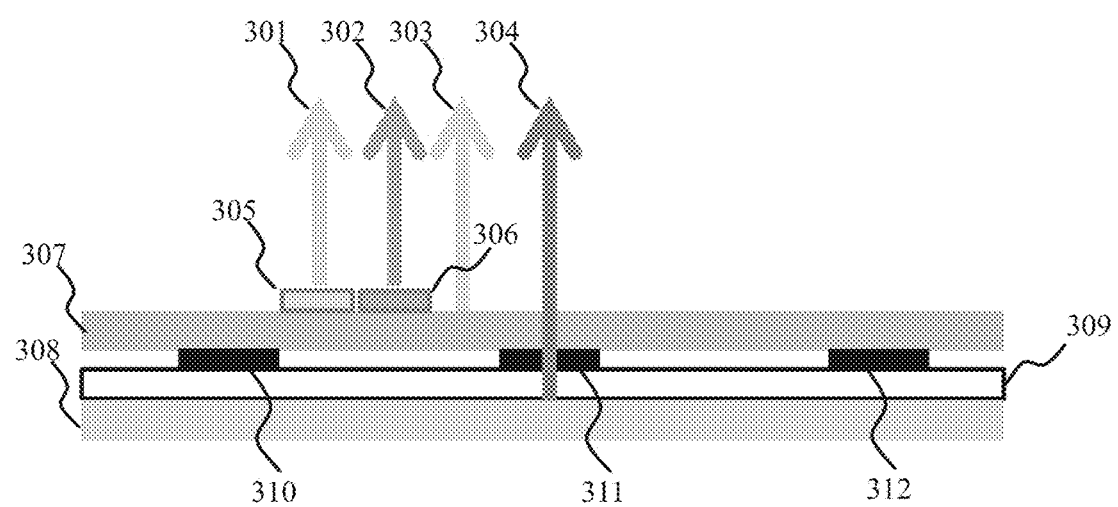
FIG. 3B shows a cross-section of a hybrid MEMS OLED display frontplane and backplane architecture according to one embodiment.

The illumination level of the unpatterned yellow OLED 307 and the position of the MEMS shutters 310 is controlled by the backplane array 309. The backplane would be formed on a substrate that in certain embodiments could be glass, metal or plastic. The substrate could be flexible and encapsulated. OLED anode contacts would then be formed as in a conventional OLED display. In certain embodiments, the TFT backplane is formed on a substrate using low temperature plastic such as heat stabilized PEN (polyethylene naphthalate) (<180° C.), therefore requiring low temperature backplane technologies, such as OTFTs (Organic thin-film transistors) or oxide TFTs but could include LTPS (low-temperature polycrystalline silicon) or amorphous silicon on glass or polyimide or metal or thin film transistors made from carbon nanotubes. In one embodiment, the backplane is an active-matrix backplane comprising an array of thin film transistors, TFTs. In another embodiment, the backplane is a passive-matrixarray. In the exemplary embodiment of FIG. 3A, the TFT array 309 is disposed between the unpatterned yellow OLED 307 and the MEMS shutters 310. In the alternate exemplary embodiment of FIG. 3B, the backplane 309 is disposed between the MEMS shutters 310 and the blue backlight layer 308.

Advantageously, an embodiment combining for example blue MEMS shutters with red and green OLEDs would significantly benefit levels of power consumption, brightness, lifetime, yield and optical performance. Using only a blue sub-pixel from the MEMS element means that a constant blue backlight can be utilized, avoiding the break up issues associated with color sequential RGB backlights. Use of an unpatterned yellow OLED placed over the blue LED and color filters used to form green and red sub-pixels yields a RGBY display. As explained in further detail below, certain embodiments share one blue MEMS sub-pixel amongst four pixels, allowing for lower resolution MEMS placement (lower than display resolution) overcoming manufacturing issues with the size and tolerance of the MEMS, also allowing for higher blue aperture and increasing efficiency. In one embodiment, the emittance of blue light from the backlight layer is uniform. In one embodiment, the blue backlight layer is separated into regions of size greater than the size of a display pixel, such that each region can be locally dimmed for additional power savings dependent on the visual content of the image to be rendered.

MEMS shutters 310 can be made using MEMS technology known in the art, such as for example the MEMS technology developed by Pixtronix, a subsidiary of Qualcomm. In one embodiment, MEMS are made by depositing thin films of silicon over large area substrates and applying MEMS etch techniques. In one embodiment, the MEMS shutter are placed under the TFT backplane and in another embodiment, the MEMS shutter are placed over the TFT backplane. Alternatively, the MEMS shutters can be on a substrate separate from the OLEDs. In one embodiment, MEMS modulated LEDs and OLEDs are deposited on separate substrates, and the LED substrate is used as a lid for the OLEDs. Here, the OLEDs are made on AM substrate for top emission. The LED could be patterned on a lid with color filters and driven in PM mode to avoid the cost of two backplanes. Since an LED driven sub-pixel is also lower resolution than OLED, this embodiment may be easier for PM drive, also improving fill factor and transparency. The shutter technology could also be for example an LCD shutter as known in the art.

For low resolution displays, OLEDs could be driven passive matrix. Using this approach can extend the usage range for passive matrix OLED displays, as only yellow OLED needs to be considered at high drive conditions, allowing for higher brightness and number of row lines PM displays. This would lower cost for small displays, and remove substrate temperature constraints, enabling very flexible wearable displays, and low resolution transparent applications. This approach could be very beneficial for digital signage, where typical requirements include high brightness, low resolution and low frame rate. Signage such as LG 84" signage operates at 2500 nits and consumes 2800 W, whereas the hybrid approach would not need a polarizer, and assuming 50% of efficiency of active matrix OLED (roll-off in yellow) would only consume 600 W. For high brightness applications, embodiments of the display are power efficient as no polarizer required. When OLEDs alone cannot perform at the high brightness levels required, embodiments of the display offer the required brightness plus the benefits of OLEDs for flexible substrates and curved displays.

In certain embodiments, once the MEMS shutter has been fabricated and, if required, an insulator formed over the device, the substrate needs to be prepared for OLED deposition. Planarization may need to be applied prior to OLED deposition. In certain embodiments, planarization could be organic or inorganic, but curing temperature may be limited by choice of substrate and backplane technology. If this planarization layer would outgas and degrade the OLED lifetime, a permeation barrier could be deposited at this stage in the display fabrication (for instance instead of depositing this barrier directly over a plastic substrate). Once the structure is planarized, vias can be introduced with subsequent metallization to form pads for the OLED anodes and connect them to the TFT backplane.

Various pixel layouts can be implemented according to the embodiments described herein. In one embodiment, unpatterned (at the pixel level) OLED emissive layers are implemented Advantageously, this avoids the use of either a fine metal mask for vacuum deposited OLEDs, or ink jet or other patterning technologies for solution processed OLEDs. OVJP would also be a preferred deposition technique according to certain embodiments. If unpatterned OLEDs are used, in certain embodiments a preferred color is yellow, and either a single emitter is utilized or an emitter is made by combining green and red emitters in the same device (in either one or two layers). Green and red sub-pixels can be realized using color filters, resulting in a four color RGBY display. Alternatively, instead of using color filters, red, green and yellow sub-pixels could be patterned by OVJP, inkjet printing, laser induced thermal imaging or another direct patterning processes for OLEDs. If patterning can be accomplished, then red and green OLEDs could be implemented in a side by side architecture, making a 3 color RGB hybrid display. Color filters can be integrated into the display to implement either top emission or bottom emission architecture. In a bottom emission approach, they can be patterned on the backplane under the OLED stack using photolithography. For top emission, the color filters can be patterned on a lid which would be aligned and sealed to the substrate.

Figure 4:
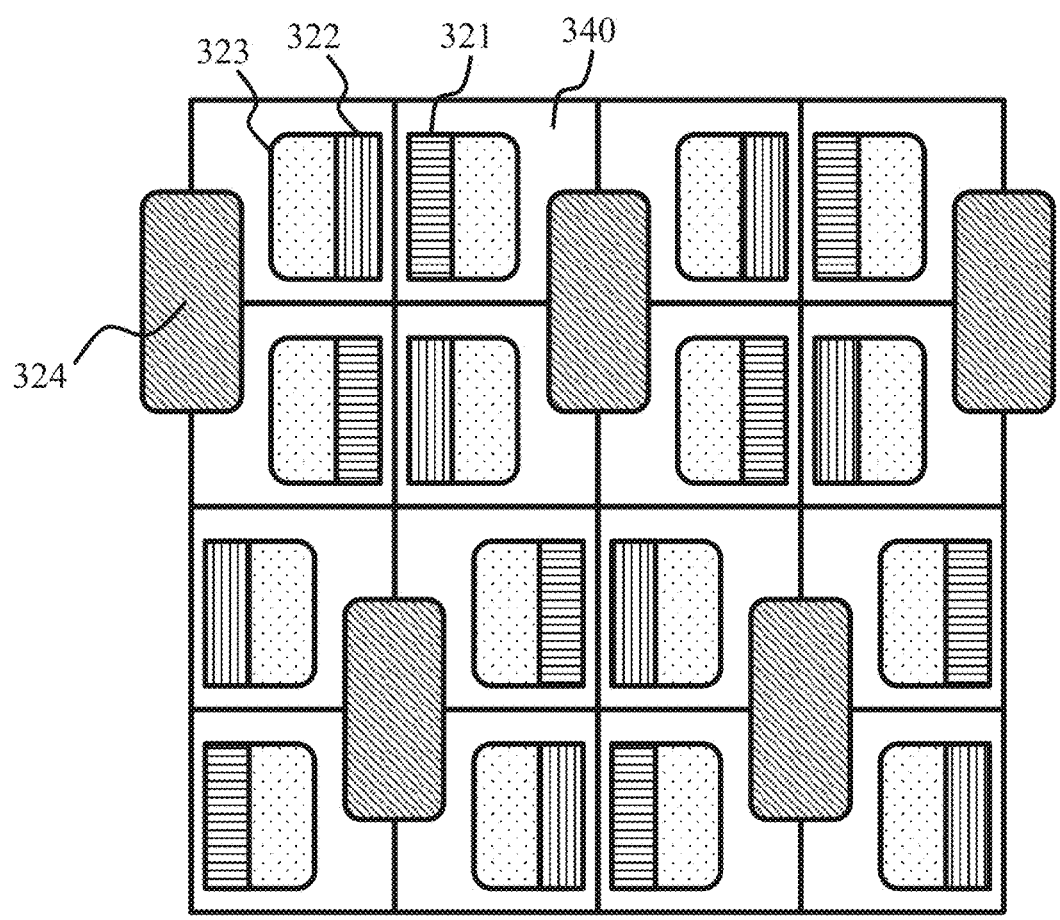
FIG. 4 shows an arrangement of pixels for a hybrid MEMS/OLED display according to one embodiment.

To provide redundancy, a pixel layout such as the one shown in FIG. 4 can be implemented, which uses one blue sub-pixel 324 shared amongst four pixels 340, including subpixels with blue 324, yellow 323, green 322 and red 321 emission according to one embodiment. In one embodiment, each pixel includes a region of unpatterned yellow OLED, and green and red color filters. Layouts according to this embodiment reduces the resolution of the blue MEMS shutters, and in-turn increases manufacturing yield and display efficiency. In addition, the relatively large blue sub-pixels can allow for multiple MEMS shutters to be positioned in each blue sub-pixel, providing redundancy without impacting resolution, which again will greatly increase display manufacturability. Further, this embodiment allows for the MEMS shutter resolution to be only half the display resolution, greatly improving display yield and manufacturability. In certain embodiments it may be desirable to place an insulator over the MEMS shutter over which to deposit and pattern the OLED anode.

Using a RGBY architecture, blue and yellow will be used in most embodiments to render images, except for when very saturated green and red colors are required. This allows for the display to have a high or wide color gamut without a power consumption penalty. Further increase in color gamut could be achieved by in one embodiment using a six color display, deep blue from LED and then five OLED sub-pixels all formed from yellow, yellow, light green, deep green, light red and deep red. The deep green and deep red would only be used a small percentage of the time, so their efficiency will not significantly impact display power consumption. These very saturated colors could be made by applying color filters over the yellow OLED, and further facilitated if these colors were to be used in a micro-cavity, such that the yellow emitting layer would be placed in a microcavity to shift the spectral output to favor deep red or deep green. This approach would be very advantageous to achieve the REC 2020 color gamut.

Certain embodiments are used with top emission OLEDs. In one embodiment, the basic OLED stack including anode assembly (thickness and index etc.) is optimized for yellow. U.S. application Ser. No. 14/698,352, incorporated by reference herein in its entirety, shows examples of how to pattern anode assembly to optimize stack design for green and red in the case of a cavity design and a yellow emitting layer, so as to avoid any OLED patterning or masking.

In certain embodiments, when using an unpatterned OLED, the sub-pixel fill factors are determined by photolithography, either by anode patterning or color filters. This means that much higher fill factors can be achieved than for an OLED which uses OLED emissive layers of different colors. In addition, the blue sub-pixel can probably have the smallest fill-factor, due to high lifetime and efficiency of the MEMS driven blue LED sub-pixel, allowing for larger yellow sub-pixel aperture ratio, further increasing display lifetime, or allowing more space to implement 6 color architecture for very wide color gamut display. For example, the small area now allocated to the blue sub-pixel could allow for light and deep red and green sub-pixels, enabling very high color saturation, without a power penalty.

In one embodiment, yellow could be single stacked or tandem. A two stacked tandem will increase display lifetime by an approximate factor of three, and also further decrease power consumption (see e.g. FIG. 4). Stacking colors is often very difficult to implement in RGB side by side displays, as it requires many deposition chambers and non-common layer OLEDs. Stacked devices could have a yellow emitter in both units, or a red emitter in one unit and a green emitter in the other. Accordingly, yellow could be a single or double component. One advantage of using a stacked red and green emitter to render RGY would be a greater realized color gamut than in the case of only a Y emitter being used to render Y. A stacked yellow and red OLED configuration may also be utilized.

A hybrid MEMS display according to embodiments described herein can be designed to be flexible. Plastic or barrier coated plastic can be used at a substrate with flexible OTFT, carbon nanotube, or metal oxide TFT backplanes. LTPS is also possible at higher cost. From cross sections shown in FIG. 3A, one can see that a critical interface will be where the MEMS shutters 310 attach to the top of the TFT backplane 309. In designing this display to be flexible it would be preferable in certain embodiments to have the neutral plane close to this interface. When a thin device is flexed, there is a neutral plane that runs through the device, which defines a plane which does not expand or contract on flexing. Regions on one side of the neutral plane will be in tensile stress and regions on the other side will be in compressive stress. To avoid delamination or cracking of materials, it is desirable to design a thin display such that stiff or inorganic materials are close to the neutral plane. The neutral plane will be in the middle of a symmetrical structure, and can be moved away from this position by materials having a large Young's modulus multiplied by their thickness, particularly if these films are placed away from the middle of the device. The current carrying electrodes for the OLED will also have a large Young's modulus, so the position and thickness of these electrodes will also determine how the neutral plane is positioned within the device. In one embodiment, buslines placed under micro LEDs near the TFTs will tend to pull the neutral plane down towards the substrate, and therefore near to the micro LED to backplane interface. So in certain embodiments, the design should allow for all the current carrying electrodes to be below the micro LEDs.

Now regarding drive architectures, the backplane functions to drive the OLED sub-pixels and to operate the MEMS shutters. These shutters could modulate the light transmission through them by either analog control—adjusting the position of the shutter for each frame so as to determine the size of the opening, or else in a pulse width modulation mode—where the shutter is fully open for only a fraction of the frame time, and this fraction determines the grey level. As preferred embodiments have more than 3 colors of sub-pixels, drive schemes can be utilized whereby the RGB video information can be parsed amongst displays having more than three different color sub-pixels (see for example, U.S. application Ser. No. 14/605,876, incorporated by reference herein in its entirety). If using MEMS over direct driven LED (see for example, U.S. application Ser. No. 14/858,875, incorporated by reference herein in its entirety), the LED would be at constant luminance and temperature, so no color shifts with grey level would result. Advantageously, grey level is provided by the position of the MEMS shutter (or time open), not by varying the drive to the blue LED.

The performance, power consumption and lifetime of devices according to embodiments of the hybrid MEMS display described herein offer significant advantages. Conventional OLED display brightness is generally limited by lifetime (blue lifetime) but the hybrid MEMS architecture may increase lifetime by at least a factor of 10, 20, 30 or higher, allowing for operation at higher luminances (and daylight readability or high dynamic range operation) with significantly reduced image sticking. In one example, current phosphorescent yellow has LT95=50,000 hours at 3,000 nits. For a daylight readable display operating at greater than 700 nits, maximum yellow sub-pixel luminance would be 8,000 nits. This would correspond to LT95=7,000 hours. Use of a stacked yellow OLED would increase lifetime 3×, leading to a display lifetime of >20,000 hours.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. The disclosures of each and every patent, patent application, and publication cited herein are hereby incorporated herein by reference in their entirety.

I claim:

1. A hybrid display, comprising:
    a blue LED backlight layer;
    at least one shutter element;
    a frontplane comprising a plurality of sub-pixels; and
    a backplane operatively connected to the frontplane and the at least one shutter element;
    wherein the backplane and the at least one shutter element are positioned between the backlight layer and the frontplane.

2. The display of claim 1, wherein the at least one shutter element is further positioned between the backlight layer and the backplane.

3. The display of claim 1, wherein the at least one shutter element is further positioned between the frontplane and the backplane.

4. The display of claim 1, wherein the LED backlight layer and one shutter element is disposed on a first substrate, and the frontplane is disposed on a second substrate.

5. The display of claim 1, wherein the at least one shutter element is a MEMS or an LCD.

6. The display of claim 1, wherein the backlight layer is a back-lit LED or an edge-lit LED.

7. The display of claim 1, wherein at least one sub-pixel is a blue sub-pixel formed from blue light emitted from the backlight layer passing through the shutter element.

8. The display of claim 7, wherein the emittance of blue light from the backlight layer is substantially uniform across the display.

9. The display of claim 7, wherein the blue backlight layer is separated into regions of size greater than the size of a display pixel, such that each region can be locally dimmed for additional power savings dependent on the visual content of the image to be rendered.

10. The display of claim 7, wherein the blue sub-pixel is shared between at least two adjacent pixels.

11. The display of claim 7, wherein the blue sub-pixel is shared between at least four pixels.

12. The display of claim 7, wherein the frontplane further comprises red and green patterned OLED sub-pixels.

13. The display of claim 7, wherein the frontplane further comprises an unpatterned yellow light emitting OLED.

14. The display of claim 13, wherein the frontplane further comprises color filters for forming red and green sub-pixels.

15. The display of claim 14, wherein the display emits light of four different colors.

16. The display of claim 15, wherein a transmitted intensity of the blue light is provided by operation of the shutter element.

17. The display of claim 16, wherein the transmitted intensity is provided by amplitude modulation of the shutter element or pulse-width (time) modulation of the shutter element.

18. The display of claim 1, wherein resolution of the at least one shutter element is less than the resolution of the display.

19. The display of claim 1, wherein shutter elements may be driven passive matrix or active matrix, and the frontplane sub-pixels may also be driven passive matrix or active-matrix.

20. A product comprising the display of claim 1, wherein the product is selected from the group consisting of: a wearable display, a virtual-reality display, an augmented reality device, a mobile device, a flat panel display, a computer monitor, a medical monitor, a television, a touch-screen, a retractable projector screen, a billboard, a general illumination device, a signal, a heads-up display, a fully transparent display, a large area wall, a theater, a stadium screen, and a sign.

* * * * *